(12) United States Patent
Hannu et al.

(10) Patent No.: US 11,548,826 B2
(45) Date of Patent: Jan. 10, 2023

(54) CERAMIC THERMAL INSULATION

(71) Applicant: OULUN YLIOPISTO, Oulu (FI)

(72) Inventors: Jari Hannu, Oulu (FI); Jari Juuti, Oulu (FI); Heli Jantunen, Oulu (FI); Mikko Nelo, Oulu (FI)

(73) Assignee: OULUN YLIOPISTO, Oulu (FI)

( * ) Notice: Subject to any disclaimer, the term of this patent is extended or adjusted under 35 U.S.C. 154(b) by 0 days.

(21) Appl. No.: 16/626,028

(22) PCT Filed: Jun. 28, 2018

(86) PCT No.: PCT/FI2018/050519
§ 371 (c)(1),
(2) Date: Dec. 23, 2019

(87) PCT Pub. No.: WO2019/002696
PCT Pub. Date: Jan. 3, 2019

(65) Prior Publication Data
US 2020/0123061 A1    Apr. 23, 2020

(30) Foreign Application Priority Data

Jun. 30, 2017 (FI) ...................... 20175634

(51) Int. Cl.
*C04B 35/495* (2006.01)
*H05K 3/28* (2006.01)
*H05K 1/18* (2006.01)

(52) U.S. Cl.
CPC ........... *C04B 35/495* (2013.01); *H05K 1/185* (2013.01); *H05K 3/284* (2013.01);
(Continued)

(58) Field of Classification Search
CPC .. H05K 3/284; H05K 5/00; H05K 2203/1316; H05K 1/185; H05K 2201/02;
(Continued)

(56) References Cited

U.S. PATENT DOCUMENTS 3,419,762 A    12/1968    Lucas
3,423,517 A    1/1969    Arrhenius
(Continued)

FOREIGN PATENT DOCUMENTS

CN    101870584    10/2010
JP    2008-127258    6/2008

OTHER PUBLICATIONS

Esa Hohtola, et al., "Acta Universitatis Ouluensis A Room-Temperature Fabrication Method for Microwave Dielectric $Li_2MoO_4$ Ceramics and Their Applicability for Antennas", Oct. 25, 2016, 62 pages.
(Continued)

*Primary Examiner* — Tabassom Tadayyon Eslami
(74) *Attorney, Agent, or Firm* — Nixon & Vanderhye PC

(57) ABSTRACT

A heat resistant electronic component is disclosed, comprising an electronic component covered by a layer of ceramic thermal insulation material containing lithium molybdate $Li_2MoO_4$. A process for manufacturing the heat resistant electronic component comprises obtaining ceramic thermal insulation material containing lithium molybdate $Li_2MoO_4$ in a mouldable form, optionally mixing the ceramic thermal insulation material with at least one additive, covering an electronic component with the material, shaping the material covering the electronic component into a desired form, and drying the desired form at a temperature of from 20° C. to 120° C.

13 Claims, 1 Drawing Sheet

(52) U.S. Cl.
CPC ............. *C04B 2235/3203* (2013.01); *C04B 2235/3256* (2013.01); *C04B 2235/604* (2013.01); *C04B 2235/606* (2013.01); *C04B 2235/6026* (2013.01); *C04B 2235/9607* (2013.01); *H05K 2201/062* (2013.01); *H05K 2203/1316* (2013.01)

(58) Field of Classification Search
CPC ... H05K 2201/0209; H05K 2203/1305; H05K 2203/13
USPC .................. 438/15, 25, 51, 55, 64, 106
See application file for complete search history.

(56) References Cited

U.S. PATENT DOCUMENTS

| | | | |
|---|---|---|---|
| 10,178,756 B1* | 1/2019 | Rohwer | ............ H05K 3/284 |
| 2009/0296361 A1 | 12/2009 | Huang et al. | |
| 2014/0238459 A1* | 8/2014 | Moors | ............ H01L 35/32 |
| | | | 136/205 |
| 2015/0195915 A1* | 7/2015 | Namkung | ............ B32B 37/26 |
| | | | 361/750 |
| 2017/0088471 A1* | 3/2017 | Randall | ............ B32B 15/08 |

OTHER PUBLICATIONS

Finnish Search Report for FI Application No. 20175634 dated Jan. 25, 2018, 2 pages.
International Search Report for PCT/FI2018/050519 dated Oct. 22, 2018, 5 pages.
Written Opinion of the ISA for PCT/FI2018/050519 dated Oct. 22, 2018, 6 pages.
Office Action dated Aug. 3, 2022 in corresponding Chinese Application No. 201880053759.2, 8 pages.

\* cited by examiner

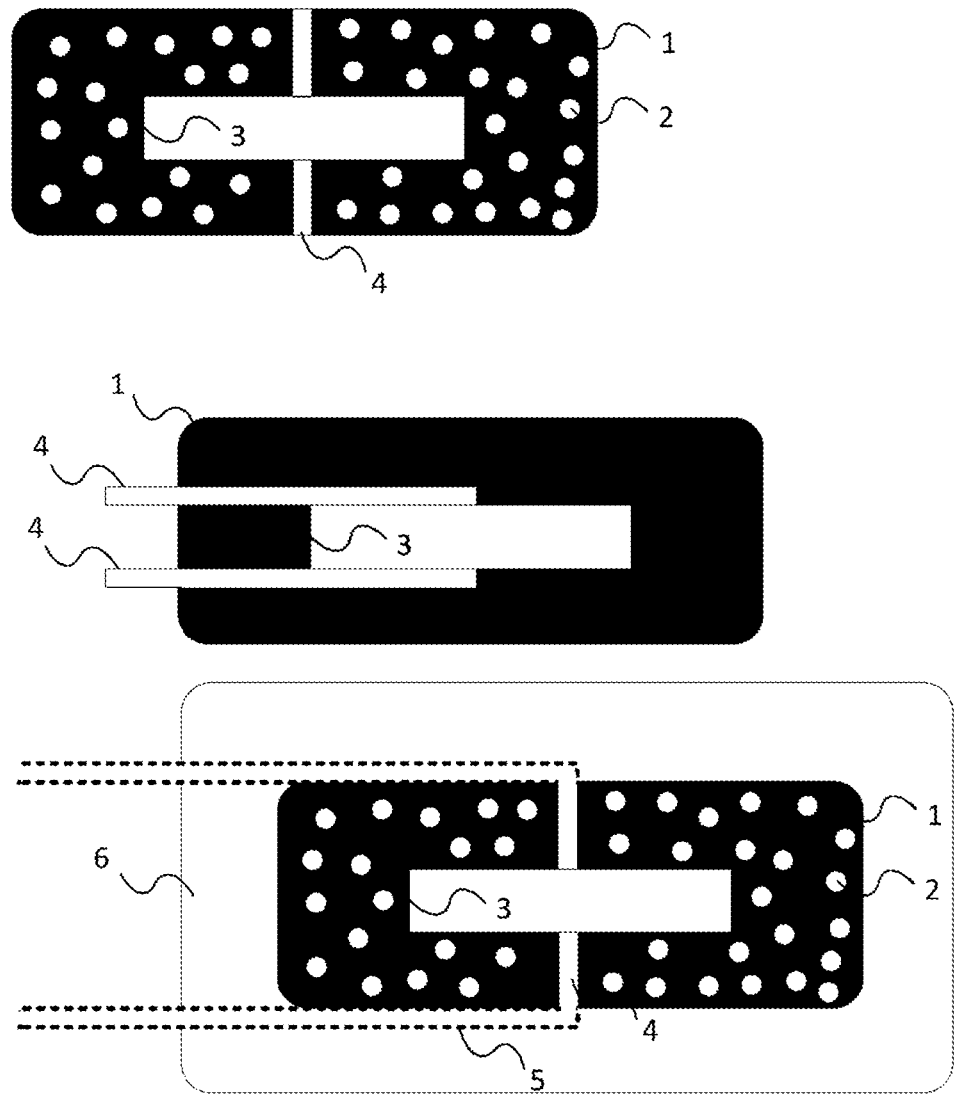

CERAMIC THERMAL INSULATION

This application is the U.S. national phase of International Application No. PCT/FI2018/050519 filed Jun. 28, 2018 which designated the U.S. and claims priority to FI Patent Application No. 20175634 filed Jun. 30, 2017, the entire contents of each of which are hereby incorporated by reference.

FIELD OF THE INVENTION

The invention relates to ceramic materials, and more particularly to thermal insulation of electronic components.

BACKGROUND

Electronic components may be active components such as semiconductors or power sources, or passive components such as resistors or capacitors. Many electronic components are sensitive to high temperatures. For example, electronic power sources such as batteries and accumulators do not withstand high temperatures. During manufacturing of an electronic product, the product may need to be exposed to an elevated temperature to carry out the manufacturing process. Examples of processes for manufacturing electronic products at an elevated temperature include overmolding, injection molding, and casting. In overmolding, electronic components are molded in plastic at an elevated temperature (e.g. 200-300° C.). Overmolding enables an increased reliability (e.g. increased physical strength, and/or increased impact tolerance) of the electronic product. Overmolding also enables a structure of the electronic product that is completely hermetically sealed. During overmolding, temperatures over 200° C. may quickly develop on the electronic component. A temperature this high may damage an electronic component or electrical interconnection so that it becomes useless. Therefore, the electronic components may be covered by thermal insulation that diminish heat entering the electronic component, thus preventing the damaging of the component by the heat exposure. To avoid the exposure of the electronic component to excessive heat during manufacture, the component may be enclosed in a housing. Thus, the electronic component is not exposed to heat during overmolding.

SUMMARY

An object of the present invention is to provide a component, process, use and product for implementing the method so as to alleviate above disadvantages. The objects of the invention are achieved by a method and an arrangement which are characterized by what is stated in the independent claims. Preferred embodiments of the invention are disclosed in the dependent claims.

In an embodiment, a process is disclosed for manufacturing a heat resistant electronic component, comprising obtaining ceramic thermal insulation material containing lithium molybdate $Li_2MoO_4$, in a mouldable form, optionally mixing the ceramic thermal insulation material with at least one additive, covering an electronic component with the material, shaping the material covering the electronic component into a desired form, and drying the desired form at a temperature of from 20° C. to 120° C.

In another embodiment, a heat resistant electronic component is disclosed, comprising an electronic component covered by a layer of ceramic thermal insulation material containing lithium molybdate $Li_2MoO_4$.

In yet another embodiment, use of lithium molybdate $Li_2MoO_4$ for thermal insulation of an electronic component is disclosed.

In yet another embodiment, use of lithium molybdate $Li_2MoO_4$ for the manufacture of a heat resistant electronic component is disclosed.

In yet another embodiment, an electronic product is disclosed, comprising the heat resistant electronic component.

BRIEF DESCRIPTION OF THE DRAWINGS

In the following the invention will be described in greater detail by means of preferred embodiments with reference to the attached drawings, in which FIG. 1 illustrates exemplary heat resistant electronic components according to the invention.

DETAILED DESCRIPTION OF EMBODIMENTS

The following embodiments are exemplary. Although the specification may refer to "an", "one", or "some" embodiment(s) in several locations, this does not necessarily mean that each such reference is to the same embodiment(s), or that the feature only applies to a single embodiment. Single features of different embodiments may also be combined to provide other embodiments. Furthermore, words "comprising", "containing" and "including" should be understood as not limiting the described embodiments to consist of only those features that have been mentioned and such embodiments may contain also features/structures that have not been specifically mentioned.

$Li_2MoO_4$ ceramics may be prepared at room-temperature based on utilization of a small amount of water with $Li_2MoO_4$ powder. The densification of the ceramic takes place by pressing and removal of excess water. Thus the shape and size of the ceramic object may be adjusted by controlling the mould dimensions and the amount of ceramic material. Post-processing may be applied at 120° C. to remove residual water from the object. However, the post-processing step is not mandatory, or the post-processing step may performed at a temperature lower than 120° C. The properties obtainable by the low temperature ceramic material may be similar to those achieved for $Li_2MoO_4$ ceramics fabricated by sintering at 540° C. An embodiment discloses thermal protection of an electronic component. An embodiment enables the manufacture of a thermally insulated electronic component. A structure is provided where the electronic component is thermally insulated against eventual heat exposure encountered during overmolding, and completely hermetically sealed (air-tight and/or gas-tight). Low temperature co-fired ceramic LTCC material, or ultra low temperature co-fired ceramic ULTCC material such as $Li_2MoO_4$, may be used as thermal insulation material for thermal protection of electronic components. A ceramic thermal insulation is provided that surrounds the electronic component. The ceramic thermal insulation material may contain lithium molybdate $Li_2MoO_4$. In addition to lithium molybdate, the thermal insulation material may contain one or more additives. The additive(s) may enhance the thermal insulation properties of the ceramic material. The additives may be in the form of particles that are mixed with the lithium molybdate. Examples of additives that may be used include polymers (such as PET or PI) or glass beads that decrease the thermal conductivity of the thermal insulation material. The additives may include air-filled polymer beads, air-filled glass beads, foaming agents, and/or porophores.

In an embodiment, the ceramic thermal insulation material contains lithium molybdate $Li_2MoO_4$, but no additives or other ingredients.

In an embodiment, instead of or in addition to lithium molybdate $Li_2MoO_4$, the ceramic thermal insulation material may contain NaCl, $Na_2Mo_2O_7$, $K_2Mo_2O$, $(LiBi)_{0.5}MoO_4$, $KH_2PO_4$, $Li_2WO_4$, $Mg_2P_2O_7$, and/or $V_2O_5$, for example.

The ceramic insulation material enables protecting the electronic component from heat/high temperatures, for example, during the manufacture of an electronic product. The ceramic insulation material has low thermal conductivity, and prevents excessive heat from reaching the electronic component, for example, during the overmolding process.

Lithium molybdate $Li_2MoO_4$ may be used as a raw material to prepare the ceramic heat insulation. The raw material may be argillaceous (clayish) material, paste, slurry, or a less viscous fluid that enables forming or molding of the material according to an embodiment.

An exemplary process for thermally insulating the electronic component with the ceramic thermal insulation material containing lithium molybdate, may include pressure molding (i.e. press molding), molding (i.e. slip casting), dipping, or 3D printing (three-dimensional printing).

The process for the manufacture of an electronic component that is thermally insulated with the ceramic thermal insulation material containing lithium molybdate, may include pressure molding (press molding), molding (slip casting), dipping, or 3D printing (three-dimensional printing).

In pressure molding, the electronic component(s) is (are) placed in a mold (die), and the mold is filled with the ceramic thermal insulation material which may be lithium molybdate in clayish form, to cover the component(s). The mold is subjected to compression, wherein most of the water present in the ceramic is removed. The molded product, i.e. the ceramic-covered electronic component is dried to remove the rest of the water. The drying may be carried out in room temperature, or the drying may be carried out at an elevated temperature to enhance the drying. The drying temperature may be 20° C. or above, preferably 50° C. to 120° C. In pressure molding, a rigid ceramic thermal insulation layer is obtainable, enabling a feasible physical strength of the component.

In 3D printing, the ceramic thermal insulation material may be printed on the electronic component by using a 3D printer that is capable of 3D printing of paste-like material. Ceramic thermal insulation material is applied on the electronic component(s) layer by layer until a desired shape of the product is obtained and/or the electronic component is completely covered by the ceramic to obtain sufficient thermal insulation of the electronic component. In 3D printing, the electronic component need not be subjected to pressure. Thus, the damage possibly caused by the pressure to the electronic component is avoided in 3D printing. Also the need to prepare the mold is avoided.

In molding (slip casting), the electronic component(s) is (are) placed in the mold (die), and the mold is filled with the ceramic thermal insulation material to cover the component(s). However, mild pressure conditions are applied during molding.

The ceramic structure obtainable by molding or 3D printing is weaker if compared to the ceramic structure obtainable by pressure molding. However, the weaker structure of the ceramic obtainable by molding or 3D printing may mean that the ceramic layer is more porous and thus provides better thermal insulation of the electronic component.

The electronic component may be partly or completely covered by the ceramic thermal insulation material, wherein the layer of the ceramic thermal insulation material on top of the component is thick enough to obtain sufficient thermal insulation of the electronic component, for example, to withstand overmolding. For example, a thickness the ceramic thermal insulation material layer covering the component may be 0.5 mm to 10 mm.

An embodiment provides a ceramic thermal insulation that may be directly applied on the electronic component. In addition to thermal protection of electronic or electric components, the ceramic thermal insulation material and process may also be utilised for thermal insulation of any other smaller objects in any field of technology, such as high temperature sensors, motor drives, etc.

In an embodiment, the electronic component is completely thermally protected, such that each part of the electronic component is thermally protected by the ceramic thermal insulation.

In an embodiment, the electronic component is only partly thermally protected; for example, a part (parts) of the electronic component that is (are) not heat sensitive, need not be thermally protected by the ceramic thermal insulation.

Examples of electronic components that may be thermally protected by the ceramic thermal insulation include batteries, supercapacitors, electrolytic capacitors, light emitting diodes (LED), active components, sensors, integrated circuits (IC), electrical interconnections. For example, the electronic component may comprise a battery and at least two electrical interconnections.

Thus the heat resistant electronic component may be an integrated entity formed by the electronic component covered by the ceramic thermal insulation.

Thus an embodiment discloses a heat resistant electronic component comprising an electronic component covered by a layer of ceramic thermal insulation material containing lithium molybdate $Li_2MoO_4$. The electronic component may comprise at least one of a battery, an electrical connection path, and conditioning electronics. The layer of ceramic thermal insulation material may contain at least one additive material to modify the heat conduction properties.

An embodiment discloses a process for manufacturing a heat resistant electronic component, comprising obtaining ceramic thermal insulation material containing lithium molybdate $Li_2MoO_4$, in a mouldable form; optionally mixing the ceramic thermal insulation material with at least one additive; covering an electronic component with the material; shaping the material covering the electronic component into a desired form; and drying the desired form at a temperature of from 20° C. to 120° C. The process may comprise at least one of 3D printing of the material on top of the electronic component, molding of the material on top of the electronic component, and pressure molding of the material on top of the electronic component.

An embodiment discloses the use of lithium molybdate $Li_2MoO_4$ for thermal insulation of an electronic component.

An embodiment discloses the use of lithium molybdate $Li_2MoO_4$ for the manufacture of a heat resistant electronic component.

An embodiment discloses an electronic product comprising said heat resistant electronic component.

FIG. 1 illustrates exemplary heat resistant electronic components comprising an electronic component covered by a layer of ceramic thermal insulation material 1 (such as $Li_2MoO_4$). The heat resistant electronic component further comprises the electronic component 3, and at least one an electrical connection 4. The heat resistant electronic component may further comprise filler material(s) 2 (such as glass beads), an electrical connection 5 with or without electrical insulation, and/or a molded/cast case 6 (e.g, of polymer/metal).

The process may be performed at a temperature of from 20° C. to 150° C.

The temperature in the process for manufacturing the component does not exceed 150° C., nor does it need to exceed the boiling temperature of the solvent. No extra heating is required in the process, instead the compression may be performed at a room temperature. Optional heat treatment may be performed after the shaping and compacting of the component. The process time to prepare the component may be only 2 to 5 min.

No forming of a mixture on two or more substrates and laminating the two or more substrates with a sintered inorganic compound or composite is required in the process.

The process and the component are provided to enhance thermal protection of the component. No compressing is required in the process, and elevated temperature of about 20-120° C. may be used for the drying only. Optionally 3D printing, molding, or pressure molding may be utilized in the process, none of which require elevated temperature. Pressure molding is not mandatory in the process.

The process may be utilized in thermal protection of an electronic product, as the components to be protected are not destroyed during the manufacture process.

The process may be performed at an atmospheric pressure.

No sintering of ceramic at extremely high temperatures (e.g. 1500° C.) is required in the process. No removal of organic additives by firing at high temperatures (e.g. 700° C.) is required in the process.

It will be obvious to a person skilled in the art that, as the technology advances, the inventive concept can be implemented in various ways. The invention and its embodiments are not limited to the examples described above but may vary within the scope of the claims.

The invention claimed is:

1. A method of manufacturing a heat resistant electronic component comprising at least one of a battery, supercapacitor, electrolytic capacitor, light emitting diode, active component, sensor, and integrated circuit, the method comprising:

obtaining lithium molybdate $Li_2MoO_4$ ceramic thermal insulation material in a mouldable form by using water and $Li_2MoO_4$ powder;

optionally mixing the lithium molybdate $Li_2MoO_4$ ceramic thermal insulation material with at least one additive;

covering an electronic component with the lithium molybdate $Li_2MoO_4$ ceramic thermal insulation material;

shaping the material covering the electronic component into a desired form by removal of excess water present in the lithium molybdate $Li_2MoO_4$ ceramic thermal insulation material; and drying the desired form at a temperature of from 20° C. to 120° C. so that the shaped and dried form provides heat resistance to the electronic component.

2. The method according to claim 1, wherein the method is performed at a temperature of 150° C. or below.

3. The method according to claim 1, wherein the method comprises:

3D printing of the lithium molybdate $Li_2MoO_4$ ceramic thermal insulation material on top of the electronic component, molding of the lithium molybdate $Li_2MoO_4$ ceramic thermal insulation material on top of the electronic component, or pressure molding of the lithium molybdate $Li_2MoO_4$ ceramic thermal insulation material on top of the electronic component.

4. The method according to claim 1, wherein the method is performed at an atmospheric pressure.

5. The method according to claim 1, wherein the method is performed at a temperature of 20° C. to 150° C.

6. The method according to claim 1, wherein the lithium molybdate $Li_2MoO_4$ ceramic thermal insulation material is prepared at room temperature using water and $Li_2MoO_4$ powder.

7. The method according to claim 6, wherein the lithium molybdate $Li_2MoO_4$ ceramic thermal insulation material is densified by pressing and the removal of the excess water.

8. The method according to claim 1, wherein the lithium molybdate $Li_2MoO_4$ ceramic thermal insulation material is low temperature co-fired ceramic (LTCC) or ultra low temperature co-fired ceramic (ULTCC) material.

9. The method according to claim 1, wherein the lithium molybdate $Li_2MoO_4$ ceramic thermal insulation material includes one or more polymer materials mixed therewith.

10. The method according to claim 1, wherein the lithium molybdate $Li_2MoO_4$ ceramic thermal insulation material consists essentially of lithium molybdate $Li_2MoO_4$, and lacks any additives.

11. The method according to claim 1, wherein the lithium molybdate $Li_2MoO_4$ ceramic thermal insulation material that is obtained in the mouldable form is argillaceous material, paste, or slurry.

12. The method according to claim 1, wherein the lithium molybdate $Li_2MoO_4$ ceramic thermal insulation material that is obtained in the mouldable form has a viscosity suitable for moulding.

13. The method according to claim 1, wherein the electronic component is hermetically sealed by the lithium molybdate $Li_2MoO_4$ ceramic thermal insulation material.

* * * * *